United States Patent
Yang et al.

(10) Patent No.: US 10,446,243 B2
(45) Date of Patent: Oct. 15, 2019

(54) STORAGE DEVICE AND ASSOCIATED CONTROL METHOD TO DETERMINE TARGET MEMORY BLOCKS FOR PROBE OPERATION

(71) Applicant: MACRONIX INTERNATIONAL CO., LTD., Hsinchu (TW)

(72) Inventors: Tzu-Yi Yang, Hsinchu (TW); Yung-Sheng Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/844,849

(22) Filed: Dec. 18, 2017

(65) Prior Publication Data

US 2019/0189227 A1 Jun. 20, 2019

(51) Int. Cl.
| | |
|---|---|
| *G11C 16/34* | (2006.01) |
| *G06F 3/06* | (2006.01) |
| *G06F 12/02* | (2006.01) |
| *G11C 16/04* | (2006.01) |

(52) U.S. Cl.
CPC .......... *G11C 16/3427* (2013.01); *G06F 3/064* (2013.01); *G06F 3/0679* (2013.01); *G06F 12/0246* (2013.01); *G11C 16/349* (2013.01); *G11C 16/0408* (2013.01)

(58) Field of Classification Search
CPC ... G11C 16/3427; G11C 16/349; G06F 3/064; G06F 3/0679
See application file for complete search history.

(56) References Cited

U.S. PATENT DOCUMENTS

| | | | | |
|---|---|---|---|---|
| 7,818,525 | B1 * | 10/2010 | Frost | G06F 12/0246 365/185.25 |
| 9,471,423 | B1 * | 10/2016 | Healy | G06F 11/1068 |
| 10,140,042 | B1 * | 11/2018 | Buxton | G06F 3/0619 |
| 2012/0278533 | A1 * | 11/2012 | Suzuki | G11C 16/3404 711/103 |
| 2013/0145082 | A1 * | 6/2013 | Tamagawa | G06F 12/0246 711/103 |
| 2014/0136883 | A1 * | 5/2014 | Cohen | G06F 11/2094 714/6.11 |
| 2014/0304567 | A1 * | 10/2014 | Hida | G06F 11/1068 714/773 |
| 2015/0339188 | A1 * | 11/2015 | Hu | G06F 11/1072 714/704 |

(Continued)

*Primary Examiner* — Mushfique Siddique
(74) *Attorney, Agent, or Firm* — McClure, Qualey & Rodack, LLP

(57) ABSTRACT

A control method for a storage device is provided. The storage device includes a memory controller and a flash memory. The flash memory includes multiple blocks. The control method includes the following steps. Maintain a state table by the memory controller, wherein the state table records a disturbance count and a last check time of the blocks in the flash memory. Trigger a probe operation on a target block in the flash memory when at least one of the following conditions is met: (a) the disturbance count of the target block is greater than or equal to a disturbance count threshold; and (b) an elapsed time period of the target block is greater than or equal to an elapsed time threshold, wherein the elapsed time period of the target block starts from the last check time of the target block.

18 Claims, 2 Drawing Sheets

(56) References Cited

U.S. PATENT DOCUMENTS

| | | | |
|---|---|---|---|
| 2016/0004437 A1* | 1/2016 | Kim | G11C 29/021 714/764 |
| 2016/0098215 A1* | 4/2016 | Song | G06F 12/0246 711/103 |
| 2016/0179597 A1* | 6/2016 | Gorobets | G06F 3/0653 714/704 |
| 2016/0371019 A1* | 12/2016 | Kang | G06F 3/0616 |
| 2017/0125111 A1* | 5/2017 | Sankaranarayanan | G06F 11/0727 |
| 2017/0277471 A1* | 9/2017 | Huang | G06F 3/0619 |
| 2018/0059948 A1* | 3/2018 | Lee | G06F 3/064 |
| 2019/0079861 A1* | 3/2019 | Amaki | G11C 29/42 |

* cited by examiner

STORAGE DEVICE AND ASSOCIATED CONTROL METHOD TO DETERMINE TARGET MEMORY BLOCKS FOR PROBE OPERATION

TECHNICAL FIELD

The disclosure relates in general to a control method for a storage device including a flash memory.

BACKGROUND

Non-volatile memory, such as flash memory, has been widely used in storage devices, such as removable flash memory cards, USB flash drives, and solid-state drives (SSD). Data stored in the flash memory might not be able to persist for a long period of time, which is often referred as data retention problem. In addition, data stored in an NAND flash may suffer from disturbance effects, including erase disturb, program disturb, and read disturb. For example, reading data from a page in an NAND flash may disturb the data stored in neighboring pages within the same block. Thus there is a need for a storage device and associated control method to enhance the data reliability in the flash memory.

SUMMARY

The disclosure is directed to a control method for a storage device including a flash memory. The memory controller triggers a probe operation on specific blocks in the flash memory, such that the data reliability can be enhanced.

According to one embodiment of the invention, a control method for a storage device is provided. The storage device includes a memory controller and a flash memory. The flash memory includes multiple blocks. The control method includes the following steps. Maintain a state table by the memory controller, wherein the state table records a disturbance count and a last check time of the blocks in the flash memory. Trigger a probe operation on a target block in the flash memory when at least one of the following conditions is met: (a) the disturbance count of the target block is greater than or equal to a disturbance count threshold; and (b) an elapsed time period of the target block is greater than or equal to an elapsed time threshold, wherein the elapsed time period of the target block starts from the last check time of the target block.

According to another embodiment of the invention, a storage device is provided. The storage device includes a flash memory and a memory controller. The flash memory includes multiple blocks. The memory controller is configured to maintain a state table recording a disturbance count and a last check time of the blocks in the flash memory, and to trigger a probe operation on a target block in the flash memory when at least one of the following conditions is met: (a) the disturbance count of the target block is greater than or equal to a disturbance count threshold; and (b) an elapsed time period of the target block is greater than or equal to an elapsed time threshold, wherein the elapsed time period of the target block starts from the last check time of the target block.

The invention will become apparent from the following detailed description of the non-limiting embodiments. The following description is made with reference to the accompanying drawings.

Figure 1:
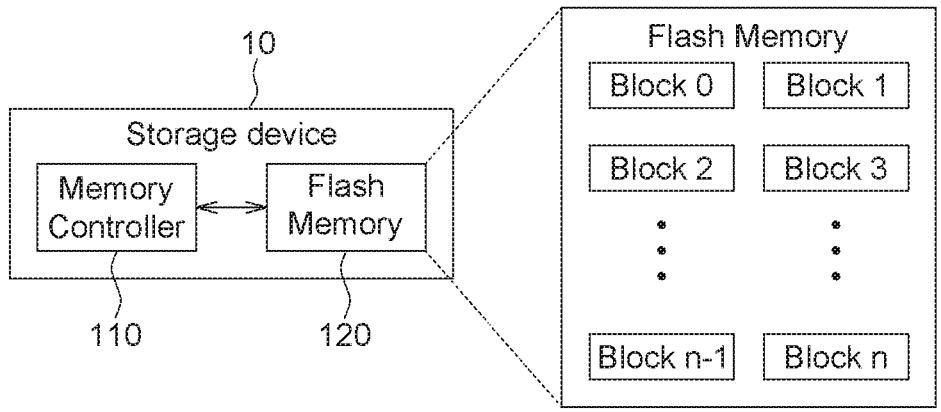
FIG. 1 shows a diagram illustrating a storage device according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 shows a diagram illustrating a storage device according to one embodiment of the invention. The storage device 10 includes a memory controller 110 and a flash memory 120. The memory controller 110 may be connected to a host, such as a computer, a cellphone, or a processor. The flash memory 120 includes multiple blocks, including block 0, block 1, . . . , block n–1, block n as shown in FIG. 1. Each block includes multiple pages. The memory controller 110 may issue various commands to the flash memory 120, including read command, program command, and erase command.

In order to enhance the data reliability of the flash memory 120, in this disclosure the memory controller 110 may initiate a probe operation, either periodically or upon meeting a specific criterion, on a target block in the flash memory 120. The purpose of the probe operation is to examine the current condition of the target block. In one embodiment, the flash memory 120 has an error correcting code (ECC) circuit capable of correcting errors if the number of error bits does not exceed an upper bound. The probe operation may involve reading data from the target block and determining how many error bits are present, which can be obtained from the ECC circuit. The memory controller 110 may start migrating data stored in the target block depending on the result of the probe operation to prevent potential data loss.

In one embodiment, the probe operation may analyze the threshold voltage (Vt) distribution of the memory cells within the target block to determine how severe the target block is damaged. In another embodiment, the probe operation may read data from the target block and compare the read data with a specific data pattern (for example, checkerboard pattern) which has been programmed to the target block. The probe operation then determines how many error bits are present according to the comparison result. Described above are some possible implementations for the probe operation. The present invention is not limited to particular implementation, and may also combine several implementations.

A control method is proposed to help the memory controller 110 decide which block is the next target block for the probe operation and when to trigger the probe operation. In one embodiment, the memory controller 110 is configured to maintain a state table. The state table records a disturbance count and a last check time of the blocks in the flash memory 120. The memory controller 110 is configured to trigger a probe operation on a target block in the flash memory 120 when at least one of the following conditions is met: (a) the disturbance count of the target block is greater than or equal to a disturbance count threshold; and (b) an elapsed time period of the target block is greater than or equal to an elapsed time threshold, wherein the elapsed time period of the target block starts from the last check time of the target block.

Figure 2:
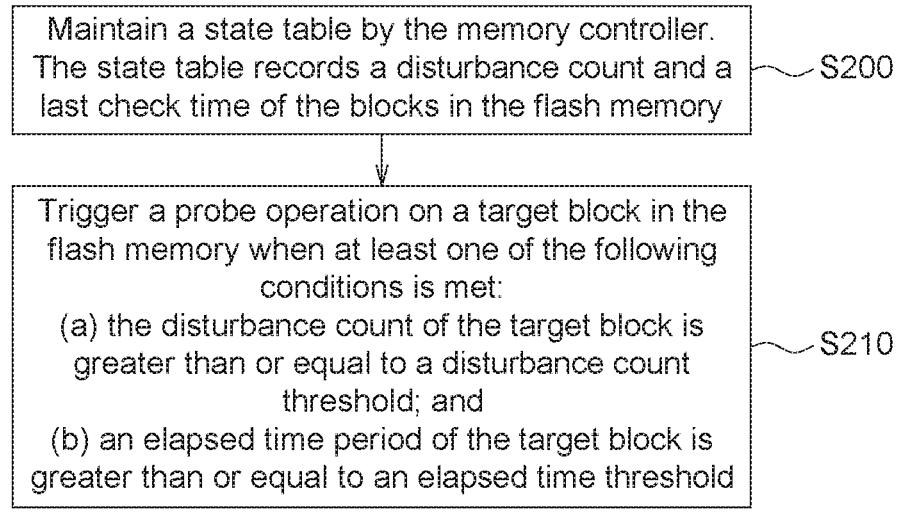
FIG. 2 shows a flowchart illustrating a control method for the storage device according to one embodiment of the invention.

FIG. 2 shows a flowchart illustrating a control method for the storage device according to one embodiment of the invention. The control method includes the following steps. Step S200: Maintain a state table by the memory controller. The state table records a disturbance count and a last check time of the blocks in the flash memory. Step S210: Trigger a probe operation on a target block in the flash memory when at least one of the following conditions is met: (a) the disturbance count of the target block is greater than or equal to a disturbance count threshold; and (b) an elapsed time period of the target block is greater than or equal to an elapsed time threshold, wherein the elapsed time period of the target block starts from the last check time of the target block.

Table 1 shows a state table maintained by the memory controller according to one embodiment of the invention. Each column in the state table corresponds to one block in the flash memory 120. The disturbance count represents how many times this block has suffered from disturbance. The disturbance may be caused by read, program, and erase operations. Thus in one embodiment, the disturbance count is the sum of the read count, the program count, and the erase count. The read count/program count/erase count represent how many times read/program/erase operations have been applied to this block respectively.

TABLE 1

|  | Block 0 | Block 1 | ... | Block 31 | ... | Block n |
|---|---|---|---|---|---|---|
| Disturbance count | 11 | 0 | ... | 10000 | ... | 3000 |
| Last check time (minute) | 1300 | 1100 | ... | 2100 | ... | 1900 |

The read operation may usually contribute most to the disturbance, and hence in one embodiment, the disturbance count may be equal to the read count. Because the read command may read data from one page in the block, the read count may be increased if any page in the block is read. In one embodiment, for maintaining the state table, the memory controller 110 is configured to increase the disturbance count of a first block when a read operation is performed on the first block, such as being performed on any page in the first block.

After a probe operation is applied to a block, the disturbance count of that block may be re-calculated because the data stored in the block has been inspected in the probe operation. In one embodiment, for maintaining the state table, the memory controller 110 is configured to reset the disturbance count of a first block (for example, reset to zero) when the probe operation is triggered on the first block. In one embodiment, the last check time for a block may refer to the last time when the probe operation is applied to this block.

If a block has a large disturbance count, the risk of data corruption is higher. In addition, if a block has not been checked for a long time, the probability there is an undetected potential problem in the block is higher. As such, the step S210 in FIG. 2 selects the target block for the next probe operation based on the disturbance count and/or the elapsed time period since the last check time.

Refer to Table 1, some exemplary parameters are given below: the current time (unit: minute) is 2300, the elapsed time threshold is 1200, and the disturbance count threshold is 10000. These values are merely for exemplary purposes rather than limiting the invention. Based on these parameters, the block 31 has reached the disturbance count threshold (the disturbance count of the block 31 is greater than or equal to the disturbance count threshold), and thus may be taken as the target block for the next probe operation.

The memory controller 110 may calculate the elapsed time period for the blocks according to the current time and the last check time. For block 0, the elapsed time period=2300−1300=1000. For block 1, the elapsed time period=2300−1100=1200. The block 1 has reached the elapsed time threshold (the elapsed time period of the block 1 is greater than or equal to the elapsed time threshold) and thus may also be eligible as the target block for the next probe operation.

In one embodiment, the state table further records an error bit number of the blocks in the flash memory 120. The memory controller 110 is configured to calculate the disturbance count threshold and the elapsed time threshold for the blocks according to the corresponding error bit number. In this embodiment, the disturbance count threshold and the elapsed time threshold used by each block may be different because each block has different error bit numbers.

The error bit numbers may be obtained during a read operation or a memory test procedure. As mentioned above, the flash memory 120 usually has a built-in ECC circuit. The number of error bits may be obtained accordingly. The error bit number obtained in a read operation is corresponding to the number of error bits in a page within a block. In one embodiment, the error bit number of a first block is a maximum number of error bits ever found among the multiple pages in the first block. For example, the error bit number is the maximum number of error bits that have been detected so far among all the pages in the first block.

After a block is erased, the circuit state of that block is refreshed. In one embodiment, the memory controller 110 is configured to reset the error bit number (for example, reset to zero) of a first block when an erase operation is performed on the first block.

The flash memory 120 may have a maximum allowable error bit number, which may be related to the error correction capability of the ECC circuit. When the detected error bit number of a block gradually approaches the maximum allowable error bit number, the data stored in that block is likely to corrupt soon. As such, the threshold value(s) for determining the probe operation may be dynamically adjusted according to the error bit number. For example, a smaller threshold value is assigned to a block with a larger error bit number, in order to reduce the waiting time for the next probe operation. In one embodiment, the threshold values (including the disturbance count threshold and the elapsed time threshold) may be calculated according to the formula below:

$$TH2 = TH1 \times \frac{(M-E)}{M},$$

where TH2 is the dynamically adjusted threshold value, TH1 is the original threshold value, E is the error bit number, and M is the maximum allowable error bit number.

Table 2 shows the state table recording the error bit number according to one embodiment of the invention. The state table shown in Table 2 has one more row recording the error bit number as compared to the state table shown in Table 1. Example values for the parameters are: the maximum allowable error bit number is 40, the current time is 2300, the elapsed time threshold before adjustment is 1200, and the disturbance count threshold before adjustment is 10000.

TABLE 2

|  | Block 0 | ... | Block 50 | Block 51 | ... | Block n |
|---|---|---|---|---|---|---|
| Disturbance count | 11 | ... | 1000 | 7500 | ... | 3000 |
| Last check time (minute) | 1300 | ... | 2000 | 1900 | ... | 1900 |
| Error bit number | 0 | ... | 30 | 10 | ... | 10 |

Based on the error bit number and the example calculation formula $$TH2 = TH1 \times \frac{(M-E)}{M},$$

the memory controller 110 calculates the updated elapsed time threshold and updated disturbance count for the blocks in the flash memory 120. Table 3 shows a table illustrating various values calculated by the memory controller based on the error bit number according to one embodiment of the invention. For example, the elapsed time threshold for the block 50 is equal to $$1200 \times \frac{(40-30)}{40} = 300.$$

The disturbance threshold for the block 51 is equal to $$10000 \times \frac{(40-10)}{40} = 7500.$$

Therefore, the block 50 has reached its elapsed time threshold, and the block 51 has reached its disturbance count threshold. These two blocks become eligible candidate blocks for the next probe operation. In this embodiment, individual threshold value for each block has been modified to reflect the impact of the error bit number. As shown in Table 3, the block 50 has the shortest elapsed time period. However, the block 50 is the only block that reaches the elapsed time threshold among all blocks in Table 3.

TABLE 3

|  | Block 0 | ... | Block 50 | Block 51 | ... | Block n |
|---|---|---|---|---|---|---|
| Elapsed time period (minute) | 1000 | ... | 300 | 400 | ... | 400 |
| Elapsed time threshold | 1200 | ... | 300 | 900 | ... | 900 |
| Disturbance count threshold | 10000 | ... | 2500 | 7500 | ... | 7500 |

In one embodiment, the state table further records an erase count of the blocks in the flash memory 120. The erase count represents how many times this block has been erased. The memory controller 110 is configured to calculate the disturbance count threshold and the elapsed time threshold for the blocks according to the corresponding erase count. In this embodiment, the disturbance count threshold and the elapsed time threshold used by each block may be different because each block has different erase count.

Flash memory cells are susceptible to degradation due to excessive Program/Erase (P/E) cycling. The flash memory 120 may have a maximum allowable erase count. When the erase count of a block is close to the maximum allowable erase count, the block potentially has a high risk in data loss. As such, the threshold value(s) for determining the probe operation may be dynamically adjusted according to the erase count. In one embodiment, the threshold values (including the disturbance count threshold and the elapsed time threshold) may be calculated according to the formula below (similar to the threshold calculation based on the error bit number):

$$TH2 = TH1 \times \frac{(N-C)}{N},$$

where C is the erase count, and N is the maximum allowable erase count.

Table 4 shows the state table recording the erase count according to one embodiment of the invention. The state table shown in Table 4 has one more row recording the erase count as compared to the state table shown in Table 1. Example values for the parameters are: the maximum allowable erase count is 1000, the current time is 2300, the elapsed time threshold before adjustment is 1200, and the disturbance count threshold before adjustment is 10000.

TABLE 4

|  | Block 0 | ... | Block 20 | ... | Block n |
|---|---|---|---|---|---|
| Disturbance count | 11 | ... | 9500 | ... | 3000 |
| Last check time (minute) | 1300 | ... | 1900 | ... | 1900 |
| Error bit number | 0 | ... | 50 | ... | 20 |

Based on the erase and the example calculation formula $$TH2 = TH1 \times \frac{(N-C)}{N},$$

the memory controller 110 calculates the updated elapsed time threshold and updated disturbance count for the blocks based on the erase count. Table 5 shows a table illustrating various values calculated by the memory controller based on the erase count according to one embodiment of the invention. For example, the disturbance threshold for the block 20 is equal to $$10000 \times \frac{(1000-50)}{1000} = 9500.$$

Therefore, the block 20 has reached its disturbance threshold and becomes an eligible candidate block for the next probe operation.

TABLE 5

|  | Block 0 | ... | Block 20 | ... | Block n |
|---|---|---|---|---|---|
| Elapsed time period (minute) | 1000 | ... | 400 | ... | 400 |
| Elapsed time threshold | 1188 | ... | 1140 | ... | 1176 |
| Disturbance count threshold | 9900 | ... | 9500 | ... | 9800 |

Figure 3A:
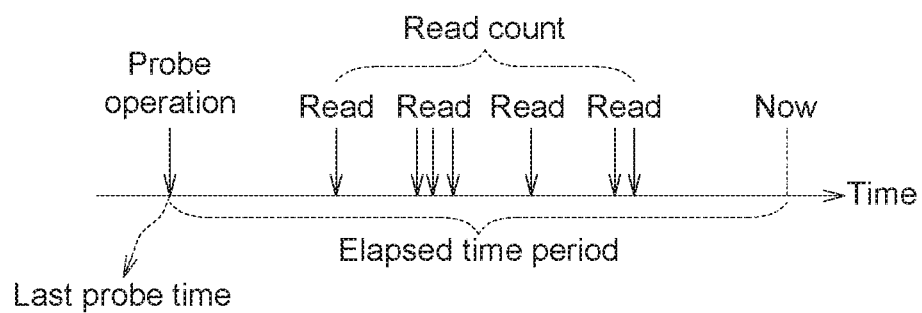
FIG. 3A shows a timing diagram illustrating the calculation of the elapsed time period according to one embodiment of the invention.

In one embodiment, the last check time for a block refers to the last time when the probe operation is applied to this block. FIG. 3A shows a timing diagram illustrating the calculation of the elapsed time period according to one embodiment of the invention. The elapsed time period is calculated as the difference between the last probe time and the current time. In this embodiment, for maintaining the state table, the memory controller 110 is configured to update the last check time of a first block when the probe operation is triggered on the first block. The read operations after the last probe time does not affect the last check time.

Figure 3B:
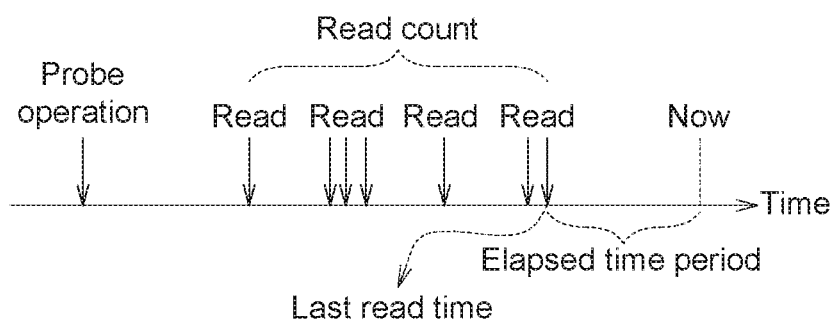
FIG. 3B shows a timing diagram illustrating the calculation of the elapsed time period according to another embodiment of the invention.

In another embodiment, the last check time for a block refers to the last time when the probe operation or the read operation is applied to this block. FIG. 3B shows a timing diagram illustrating the calculation of the elapsed time period according to another embodiment of the invention. The elapsed time period is calculated as the difference between the last read time and the current time. In this embodiment, for maintaining the state table, the memory controller 110 is configured to update the last check time of a first block when a read operation is performed on the first block.

In the embodiments shown in FIG. 3A and FIG. 3B, the number of read operations between the last probe time and the current time are calculated as the read count, which contributes to the disturbance count. The elapsed time threshold for the probe condition is related to the data retention problem, while the disturbance count threshold is related to the disturbance problem. The data retention problem and the disturbance problem in the flash memory may cause the memory cell distribution shift in opposite directions. For example, the distribution moves toward lower threshold voltage in data retention problem, while the distribution moves toward higher threshold voltage in disturbance problem. As such, the data retention effect and the read disturb effect sometimes effectively compensate each other. Consequently, the read operations after the last probe as shown in FIG. 3B might be actually beneficial to the flash memory. Therefore the elapsed time period in FIG. 3B is defined as the difference between the last read time and the current time in this embodiment.

According to the embodiments given above, a control method and a memory controller are proposed to determine when and which memory block is going to be applied a probe operation. The probe operation is useful for identifying memory blocks with potential data loss problem, such that data migration in the flash memory can be performed before the data corrupts. The proposed method considers the disturbance count and the elapsed time period since the last check time, and thus memory blocks that are most likely to suffer data loss problem can be found. In addition, the probe criterion for each block can be set individually based on the error bit number and/or the erase count of each block. As such, the blocks with potential problems can be located more accurately and can be probed as early as possible.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A control method for a storage device comprising a memory controller and a flash memory, the flash memory comprising a plurality of blocks, the control method comprising:
   recording a disturbance count and a last check time of the plurality of blocks in the flash memory; and
   triggering a probe operation on a target block in the flash memory when at least one of the following conditions is met:
   (a) the disturbance count of the target block is greater than or equal to a disturbance count threshold, wherein the disturbance count threshold is adjusted according to an error bit number; and
   (b) an elapsed time period of the target block is greater than or equal to an elapsed time threshold, wherein the elapsed time period of the target block starts from the last check time of the target block;
   wherein the memory controller records the error bit number of the plurality of blocks in the flash memory;
   the disturbance count threshold and the elapsed time threshold for each of the plurality of blocks are calculated according to the corresponding error bit number of each of the plurality of blocks; and
   the memory controller starts migrating data stored in the target block depending on a result of the probe operation performed on the target block.

2. The control method according to claim 1, wherein the step of recording a disturbance count and a last check time of the plurality of blocks in the flash memory comprises:
   updating the last check time of a first block when the probe operation is triggered on the first block.

3. The control method according to claim 1, wherein the step of recording a disturbance count and a last check time of the plurality of blocks in the flash memory comprises:
   updating the last check time of a first block when a read operation is performed on the first block.

4. The control method according to claim 1, wherein the step of recording a disturbance count and a last check time of the plurality of blocks in the flash memory comprises:
   increasing the disturbance count of a first block when a read operation is performed on the first block.

5. The control method according to claim 1, wherein the step of recording a disturbance count and a last check time of the plurality of blocks in the flash memory comprises:
   resetting the disturbance count of a first block when the probe operation is triggered on the first block.

6. The control method according to claim 1, wherein the disturbance count is a sum of a read count, a program count, and an erase count.

7. The control method according to claim 1, wherein the error bit number of a first block is a maximum number of error bits among a plurality of pages in the first block.

8. The control method according to claim 1, wherein the step of recording a disturbance count and a last check time of the plurality of blocks in the flash memory comprises:
   resetting the error bit number of a first block when an erase operation is performed on the first block.

9. The control method according to claim 1, wherein the memory controller further records an erase count of the plurality of blocks in the flash memory, and the control method further comprises:

calculating the disturbance count threshold and the elapsed time threshold for the plurality of blocks according to the corresponding erase count.

10. A storage device, comprising:
a flash memory, comprising a plurality of blocks; and
a memory controller, configured to record a disturbance count and a last check time of the plurality of blocks in the flash memory, and to trigger a probe operation on a target block in the flash memory when at least one of the following conditions is met:
(a) the disturbance count of the target block is greater than or equal to a disturbance count threshold, wherein the disturbance count threshold is adjusted according to an error bit number; and
(b) an elapsed time period of the target block is greater than or equal to an elapsed time threshold, wherein the elapsed time period of the target block starts from the last check time of the target block,
wherein the memory controller further records the error bit number of the plurality of blocks in the flash memory;
the memory controller is configured to calculate the disturbance count threshold and the elapsed time threshold for each of the plurality of blocks according to the corresponding error bit number of each of the plurality of blocks; and
the memory controller starts migrating data stored in the target block depending on a result of the probe operation performed on the target block.

11. The storage device according to claim 10, wherein the memory controller is configured to update the last check time of a first block when the probe operation is triggered on the first block.

12. The storage device according to claim 10, wherein the memory controller is configured to update the last check time of a first block when a read operation is performed on the first block.

13. The storage device according to claim 10, wherein the memory controller is configured to increase the disturbance count of a first block when a read operation is performed on the first block.

14. The storage device according to claim 10, wherein the memory controller is configured to reset the disturbance count of a first block when the probe operation is triggered on the first block.

15. The storage device according to claim 10, wherein the disturbance count is a sum of a read count, a program count, and an erase count.

16. The storage device according to claim 10, wherein the error bit number of a first block is a maximum number of error bits among a plurality of pages in the first block.

17. The storage device according to claim 10, wherein the memory controller is configured to reset the error bit number of a first block when an erase operation is performed on the first block.

18. The storage device according to claim 10, wherein the memory controller further records an erase count of the plurality of blocks in the flash memory, and the memory controller is configured to calculate the disturbance count threshold and the elapsed time threshold for the plurality of blocks according to the corresponding erase count.

* * * * *